(12) United States Patent
Ranjan

(10) Patent No.: US 7,183,626 B2
(45) Date of Patent: Feb. 27, 2007

(54) PASSIVATION STRUCTURE WITH VOLTAGE EQUALIZING LOOPS

(75) Inventor: Niraj Ranjan, El Segundo, CA (US)

(73) Assignee: International Rectifier Corporation, El Segundo, CA (US)

( * ) Notice: Subject to any disclaimer, the term of this patent is extended or adjusted under 35 U.S.C. 154(b) by 122 days.

(21) Appl. No.: 10/991,167

(22) Filed: Nov. 17, 2004

(65) Prior Publication Data

US 2006/0102984 A1  May 18, 2006

(51) Int. Cl.
*H01L 29/00* (2006.01)

(52) U.S. Cl. .................. 257/537; 257/528; 257/536; 257/379; 257/380; 257/489; 257/491

(58) Field of Classification Search ........ 257/536–537, 257/528, 379–380, 577, 487–491, 494–495, 257/335, 337, 339
See application file for complete search history.

(56) References Cited

U.S. PATENT DOCUMENTS

| | | | |
|---|---|---|---|
| 3,890,698 A * | 6/1975 | Clark ......................... 438/384 |
| 4,157,563 A | 6/1979 | Bosselaar | |
| 4,947,232 A * | 8/1990 | Ashida et al. .............. 257/336 |
| 5,382,825 A | 1/1995 | Neilson | |
| 5,382,826 A * | 1/1995 | Mojaradi et al. ........... 257/489 |
| 5,714,396 A * | 2/1998 | Robb et al. ................. 438/510 |
| 2005/0189603 A1* | 9/2005 | Inao et al. .................. 257/495 |
| 2005/0230777 A1* | 10/2005 | Chiola et al. .............. 257/480 |

OTHER PUBLICATIONS

International Search Report Mailed Aug. 30, 2006 for PCT Application No. PCT/US05/41734.

* cited by examiner

*Primary Examiner*—Zandra V. Smith
*Assistant Examiner*—Thanh Y. Tran
(74) *Attorney, Agent, or Firm*—Ostrolenk, Faber, Gerb & Soffen, LLP

(57) ABSTRACT

A semiconductor device which includes a passivation structure formed with a conductive strip of resistive material that crosses itself once around the active region of the device to form a first closed loop, a continuous strip that loops around the first closed loop without crossing itself which crosses itself a second time to form a second closed loop.

15 Claims, 4 Drawing Sheets

PASSIVATION STRUCTURE WITH VOLTAGE EQUALIZING LOOPS

BACKGROUND OF THE INVENTION

The present invention relates to a semiconductor device and more particularly to a semiconductor device that includes an edge passivation structure.

A typical semiconductor device usually includes an active region which terminates at a PN junction.

The breakdown down voltage of a PN junction formed in a substrate is usually less than its theoretical limit because certain locations on the PN junction have a tendency to develop higher electric fields. The PN junction at the terminal edge of the active region of a device, for example, experiences higher electric fields particularly at locations of low radius of curvature.

To reduce the intensity of the electric fields near the PN junction at the terminal edge of the active region, high voltage semiconductor devices may include an edge passivation structure. An edge passivation structure provides a transition region in which the high electric fields around the active area change gradually to the lower potential at the edge of the device. A passivation structure lowers the field intensity around the termination region of a PN junction by spreading the electric field lines across the edge passivation region.

U.S. Pat. No. 5,382,825 discusses a variety of passivation structures and their respective drawbacks. To improve on the prior art passivation structures discussed therein, U.S. Pat. No. 5,382,825 discloses a passivation structure which includes a spiral ribbon of resistive material disposed around the active region of a semiconductor device to gradually relieve the electric fields near the termination region of a PN junction in a semiconductor device.

The spiral ribbon disclosed by U.S. Pat. No. 5,382,825 never crosses itself. As a result, the position of the end of the spiral ribbon closest to the active region determines the initial voltage from which voltage drop around the active region begins. This initial voltage, however, may not be representative of the intensity of the electric field around the active region.

To "equalize" the voltage, U.S. Pat. No. 5,382,825 suggests forming a field plate around the active region. The suggested width for the field plate is three times the depth of the PN junction surrounding the active region. This width could occupy a large area on the surface of the die, thereby increasing the size of the die.

Also, the spiral ribbon has a width which varies so that the resistance of the ribbon is equalized throughout its length. In practice, such a ribbon may be difficult to manufacture with precision. As a result the resistance along the length of the ribbon may vary in an unpredictable manner leading to fluctuations in the voltage drop rather than a smooth, near linear voltage drop.

SUMMARY OF THE INVENTION

It is an object of the present invention to provide a passivation structure to reduce the electric fields around the active region of a semiconductor die.

According to the present invention a passivation structure includes a conductive strip of resistive material which crosses itself once to form a first closed loop and then terminates by crossing itself a second time to form a second closed loop.

According to the present invention the first closed loop of an electrically conductive but resistive material is disposed around the active region of a semiconductor device and serves as the inner boundary of the passivation structure, the second closed loop of the electrically resistive material is disposed around the first closed loop and serves as the outer boundary of the passivation structure, and a looping strip of the electrically resistive material of the same width as the inner closed loop and the outer closed loop loops around the first closed loop without crossing itself and terminates at the second closed loop.

The inner closed loop and the outer closed loop provide a substantially uniform voltage to the ends of the looping strip, and because the inner closed loop and the outer closed loop are about the same width as the continuous strip they occupy far less space than the field plates suggested by the prior art.

According to another embodiment of the present invention the continuous strip is doped to include PN junctions to provide step-wise (rather than continuous) voltage drops along the length of the continuous strip.

According to yet another aspect of the present invention a conductive metallic layer is deposited above at least the PN junctions in the continuous strip to improve (reduce) its RC time constant and to reduce total resistance.

Other features and advantages of the present invention will become apparent from the following description of the invention which refers to the accompanying drawings.

DETAILED DESCRIPTION OF EMBODIMENTS OF THE INVENTION

Figure 2:
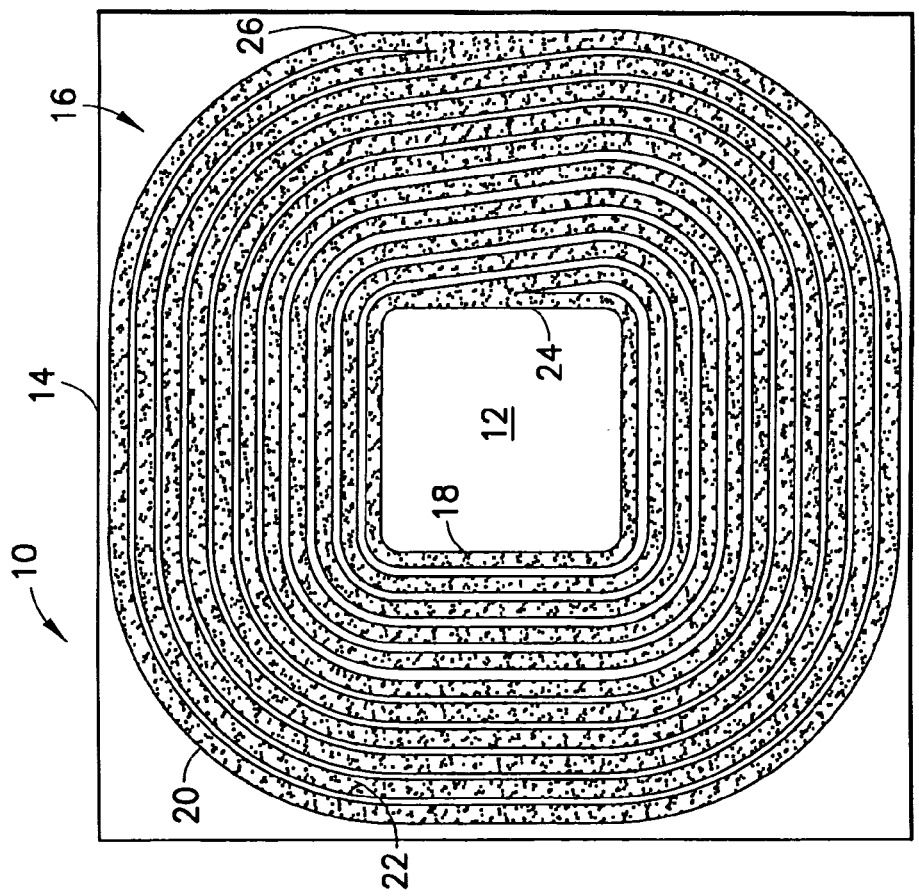
FIG. 2 shows a top plan view of a passivation structure according to the first embodiment of the present invention.

Referring to FIG. 2, the first embodiment of the present invention is a semiconductor device 10 which includes an active region 12 formed on a major surface of a semiconductor die 14. Active region 12 may include active elements that form a particular semiconductor device such as a power MOSFET, power IGBT, power bipolar device, power diode and so on. Device 10 includes passivation structure 16 formed around active region 12. Passivation structure 16 is formed from a continuous conductive strip of resistive material such as N-type doped polysilicon and includes an inner closed loop 18 which is located immediately around active region 12, and outer closed loop 20 formed around inner closed loop 18 and serving as the outer boundary of passivation structure 16. Inner closed loop 18 has a rectangular shape with rounded corners and thus includes two pairs of parallel straight sides connected to one another by four arcs. The outer closed loop 20 has substantially the same shape as the inner closed loop. Disposed between inner closed loop 18 and outer closed loop 20 is a looping strip 22 of resistive material which begins from and loops around inner closed loop 18 without crossing itself and terminates at outer closed loop 20.

Any number of loops can be used, depending on the total resistance desired, and the resistivity of each loop.

Inner closed loop 18 is formed by having the resistive strip cross itself once before looping strip 22 begins its multiple loops, and outer closed loop 22 is formed by having the continuous strip cross itself a second time before it terminates. Both closed loops serve to equalize the voltage at each end of looping strip 22, thereby allowing a more uniform voltage drop around active region 12.

In the first embodiment of the present invention, one end of a looping strip 22 is connected to one straight side 24 of inner closed loop 18 and initially extends away at an angle to the one straight side 24, and then parallels the outer boundary of inner closed loop 18 for its first loop. Thereafter, looping strip 22 parallels its first loop around inner closed loop 18 and terminates at one straight side 26 of outer closed loop 20. Note that according to an aspect of the present invention looping strip 22 terminates at a side of outer closed loop 20 which has the same positional relationship as the side of inner closed loop 18 from which looping strip 22 begins. Specifically, for example, looping strip 22 begins at the right straight side 24 of inner closed loop 18 and terminates at the right straight side 26. As a result, looping strip 22 will cover substantially the same area on all sides of inner closed loop 18. As seen, for example, in FIG. 2 looping strip 22 loops around inner closed loop 8 nine time.

Preferably, each loop of looping strip 22 is spaced from an adjacent loop by the same distance, and looping strip 22 has substantially the same width throughout.

Also, preferably, inner closed loop 18 and outer closed loop 20 have the same width as looping strip 22.

Figure 1:
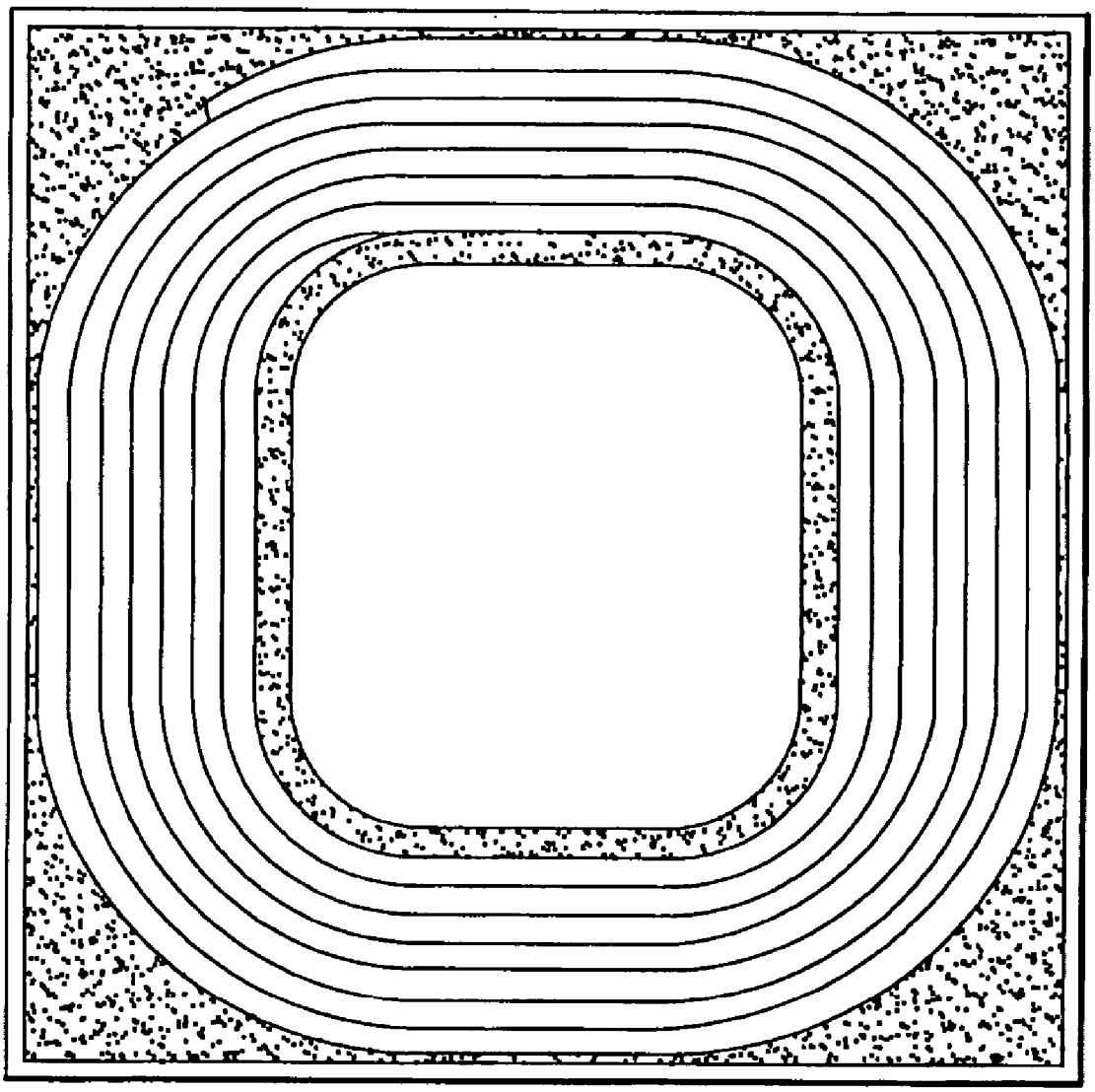
FIG. 1 shows a top plan view of a passivation structure according to the prior art.
Figure 3:
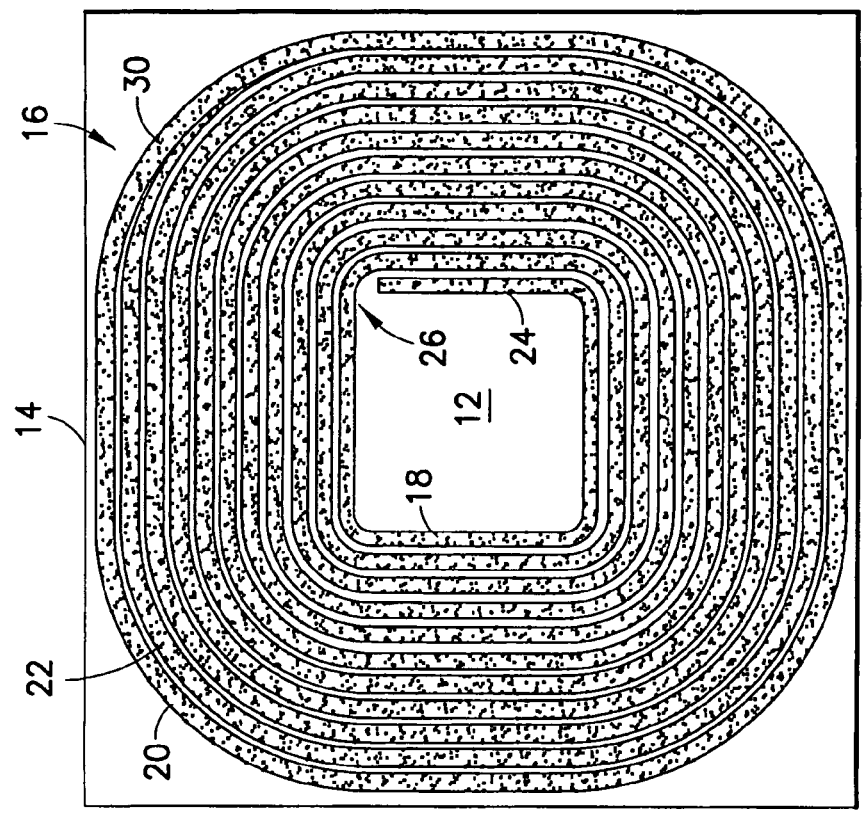
FIG. 3 shows a top plan view of a passivation structure according to the second embodiment of the present invention.

Referring now to FIG. 3, the second embodiment of the present invention includes all of the features of the first embodiment, except that in the second embodiment, looping strip 22 is connected to one corner 28 of inner closed loop 18 and terminates at a corner 30 of outer closed loop 20. Looping strip 22 terminates at a corner 30 of the outer closed loop 20 which has the same positional relationship as the corner 28 of inner closed loop 18 and terminates at a corner 30 of outer closed loop 20. Specifically, for example, looping strip 22 begins at the upper right corner of inner closed loop 18 and terminates at the upper right corner of outer closed loop 20. Similar to the first embodiment, looping strip 22 in the second embodiment then follows the outer contour of inner closed loop 18 without crossing itself until it terminates at outer closed loop 20.

Figure 4:
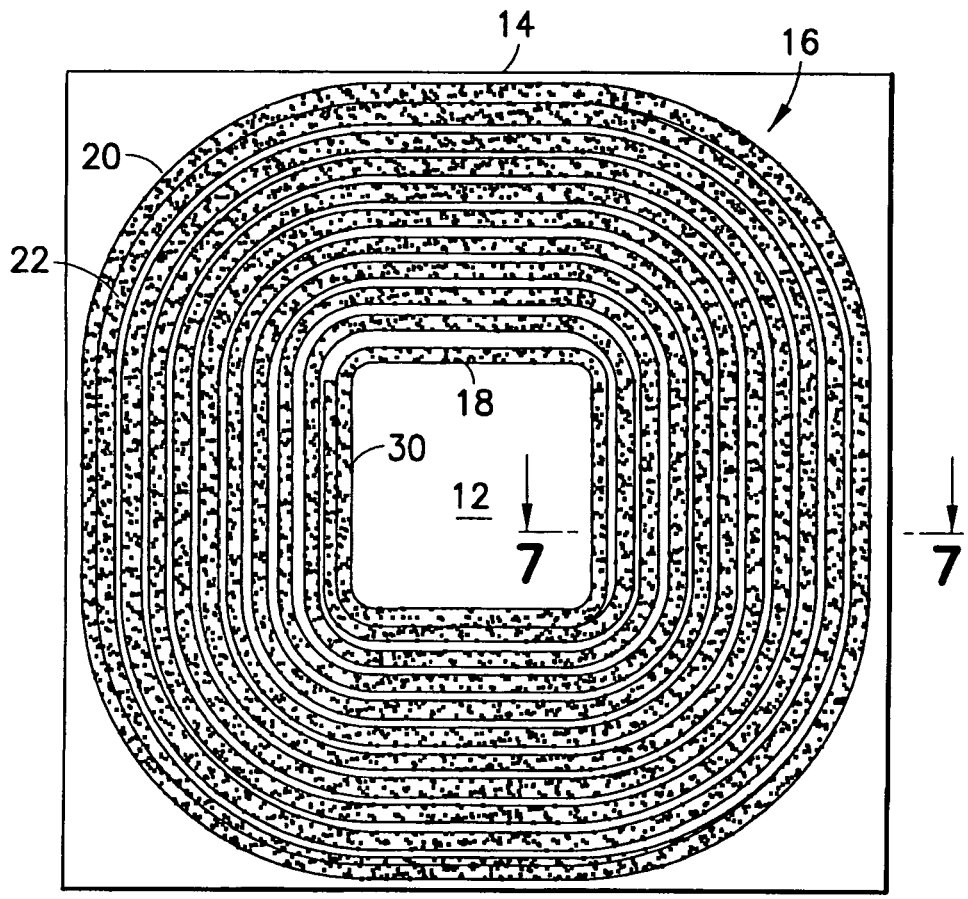
FIG. 4 shows a top plan view of a passivation structure according to the third embodiment of the present invention.

Referring now to FIG. 4, a device according to the third embodiment of the present invention includes all of the elements of the first and second embodiments except that looping strip 22 in the third embodiment is connected to and merged with one side 32 of inner closed loop 18, and follows the outer contour of inner closed loop 18 while gradually becoming spaced from the outer boundary of inner closed loop 18. After its first loop, looping strip 22 follows the contour of its first loop and gradually merges with the outer closed loop 20. It should be noted that looping strip 22 merges into outer closed loop 20 at a location which is positionally the same as the location on the inner closed loop 18 where it starts to merge out. Specifically, for example, looping strip 22 starts to merge out at the left side of inner closed loop 18 and then terminates by merging into the left side of outer closed loop 20.

Passivation structure 16 in a typical device according to the present invention may be formed by deposition and doping of a polysilicon layer in a desired location on die 14, and then patterning the desired structure using a photolithographic step. To achieve a desirable voltage drop for a 600V device the continuous strip may have a resistivity of 100 megaohms, be 1.0µ wide, and loop forty six times with each loop being spaced from adjacent loops by about 0.5µ.

The passivation structure according to the present invention may be doped with dopants of one conductivity such as N-type conductivity. Any number of loops, and any related resistivity can be used to obtain the desired total resistance.

Passivation structure 16 may be also constructed to include regions of opposite conductivity resulting in a structure that includes PN junctions at any desired location. A PN junction serves to drop the voltage in a step-wise manner rather than linearly. Each PN junction would thus form a diode.

For example, to reach a reasonable voltage drop the passivation structure may be devised to include twenty five loops each loop having four diodes each serving to drop six volts.

Figure 5:
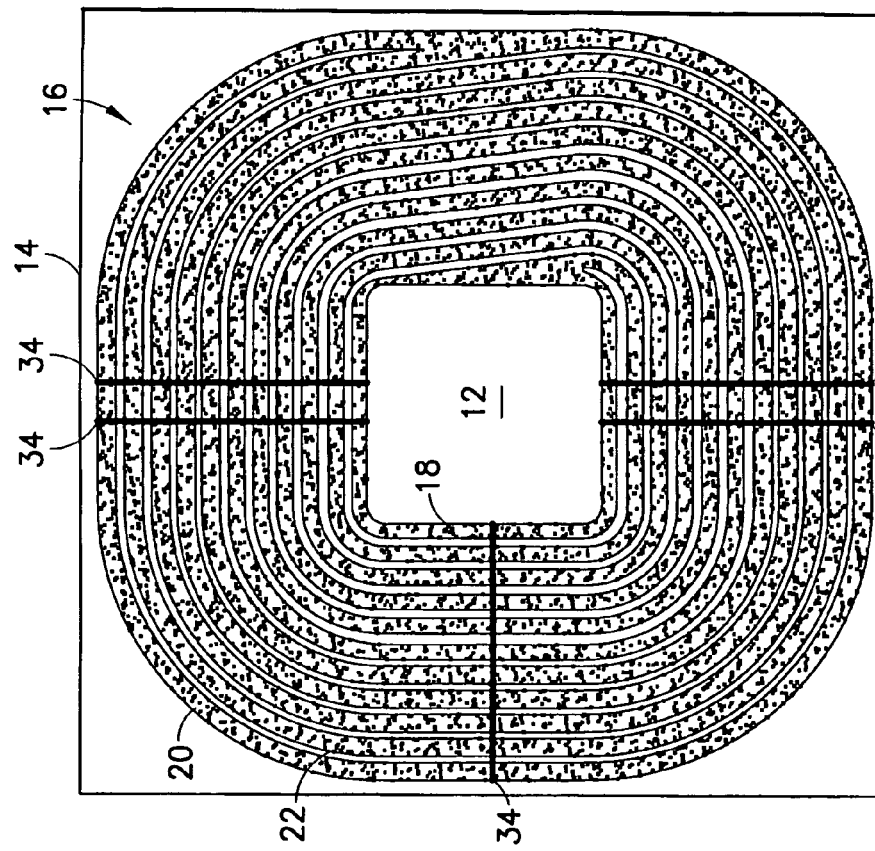
FIG. 5 shows a top plan view of a passivation structure according to the fourth embodiment of the present invention.

Referring to FIG. 5, to form PN junctions in looping strip 22, a mask can be employed to allow for counterdoping of the desired sections of looping strip 22. FIG. 5 shows, for example, P-type regions 34 intersecting N-type looping strip 22 to form PN junctions in continuous strip 22.

It has been determined, however, that passivation structures that include diodes exhibit relatively high capacitance which is undesirable particularly under high dv/dt conditions. To reduce the high capacitance the polysilicon between the diodes can be shorted by a metallic layer or silicide at least, for example, at the bends in each loop (90° positions).

Figure 6:
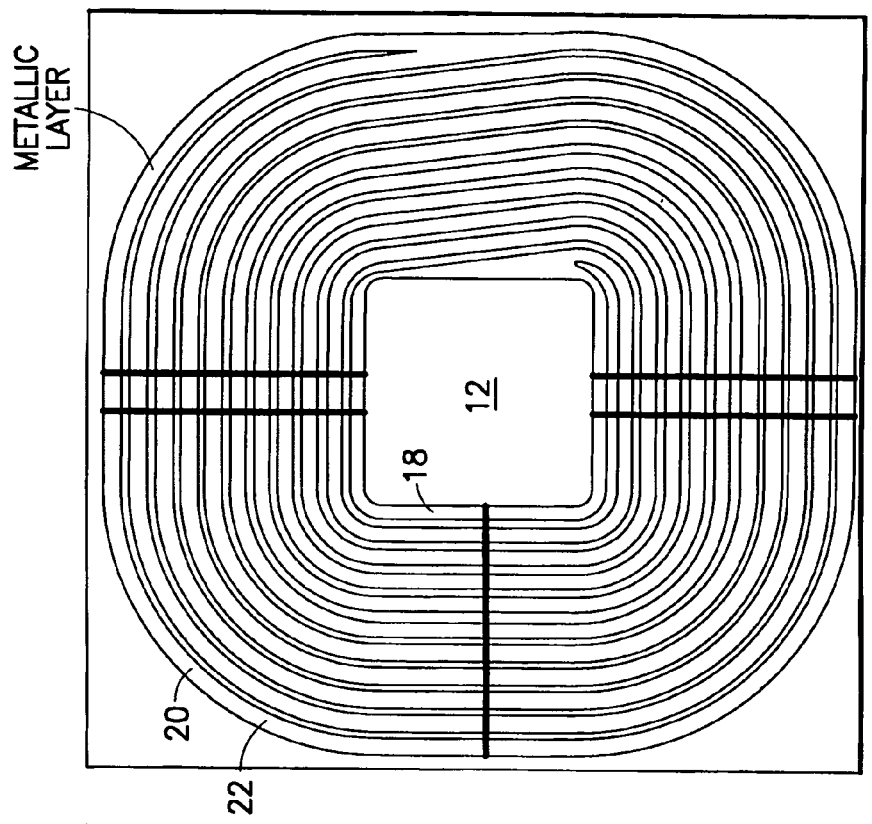
FIG. 6 shows a top plan view of a passivation structure according to the fifth embodiment of the present invention.

Referring to FIG. 6, for example, a layer of metal (illustrated by a darkened layer) may be formed over looping strip 22 that includes PN junctions. The resulting effect of including a metallic layer over looping strip 22 is a reduction in its resistance, which in turn lowers its RC time constant.

Figure 7:
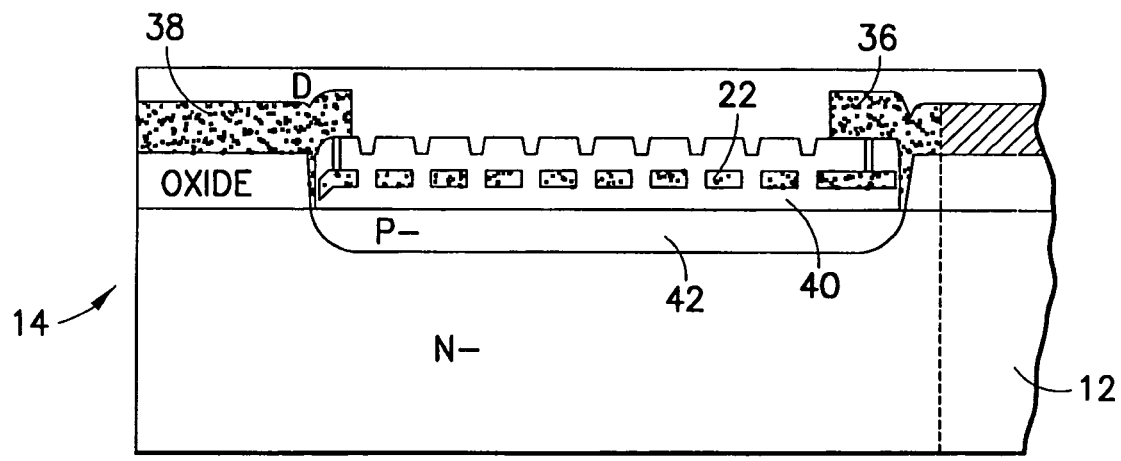
FIG. 7 shows a cross-sectional view of a passivation structure viewed along line 7—7 of FIG. 4 in the direction of the arrows.

Referring now to FIG. 7, passivation structure 16 is connected between contact 36 of the active region 12 and contact 38 to the high side of the device. Passivation structure 16 is formed over oxide layer 40, which is disposed over die 14. A region 42 of opposite conductivity to the conductivity of the die is formed under thick oxide layer 40. Preferably, region 42 includes a resurf concentration of dopants. In the preferred embodiment, die 14 is doped with N-type dopants, while region 42 is doped with P-type dopants. It should be noted that oxide layer 40 can be about 0.5µ instead of 1.0µ as required in prior art devices because voltage is very gradually graded.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A semiconductor device comprising:
   a semiconductor die body of a first conductivity type;
   an active region formed in said semiconductor body, said active region including a region of a second conductivity type terminating near the peripheral border of said active region; and a passivation structure disposed around said active region, said passivation structure including a continuous strip of resistive material of substantially uniform width, said continuous strip crossing itself once around said active region to form a first closed loop of an electrically resistive material that serves as an inner boundary of said passivation structure, and a second time to form a second closed loop of said electrically resistive material around said first closed loop and serving as an outer boundary of said passivation structure, and a looping strip of said electrically resistive material that loops around said first closed loop without crossing itself and terminates at said second closed loop;

wherein said looping strip extends from the outer edge of said first closed loop at one end thereof and terminates at the inner edge of said second closed loop at its other end.

2. A semiconductor device according to claim 1, wherein said electrically resistive material is comprised of polysilicon.

3. A semiconductor device according to claim 1, wherein said continuous strip of electrically resistive material includes regions of a first conductivity type adjacent regions of a second conductivity type.

4. A semiconductor device according to claim 1, wherein said passivation structure is disposed over a thick insulation layer.

5. A semiconductor device according to claim 1, wherein said passivation structure is disposed over a region of said second conductivity type in said semiconductor body which is doped with a resurf concentration of dopants.

6. A semiconductor device according to claim 1, wherein said first closed loop includes a plurality of bent portions connected to one another with straight portions to form a closed loop.

7. A semiconductor device according to claim 6, wherein said looping strip of said electrically resistive material makes electrical contact with one of said corners of said first closed loop.

8. A semiconductor device according to claim 7, wherein said looping strip includes straight portions that are parallel to said straight portions of said first closed loops.

9. A semiconductor device according to claim 6, wherein said looping strip of said electrically resistive material makes electrical contact with one of said straight portions.

10. A semiconductor device according to claim 9, wherein said looping strip of said electrically resistive material includes a first straight portion that makes electrical contact with one of said straight portions of said first closed loop and extends away from the same at an angle, said looping strip further including a plurality of straight portions parallel to said first straight portion.

11. A semiconductor device according to claim 10, wherein said looping strip includes further straight portions parallel to one another and parallel to respective straight portions of said first closed loop.

12. A semiconductor device according to claim 1, wherein said first closed loop includes a plurality of opposing sides, and said looping strip includes respective portions spaced from one another and incrementally spaced radially away from each of said opposing sides, wherein at least one group of said spaced portions extending from one side of said first closed loop is doped with dopants of a first conductivity type and dopants of said second conductivity type together forming PN junctions in said looping strip.

13. A semiconductor device according to claim 12, further comprising a metallic short connecting said PN junctions.

14. A semiconductor device according to claim 1, wherein said continuous strip includes at least one PN junction formed therein and a metallic short formed on said PN junction.

15. A semiconductor device according to claim 1, further comprising a metallic layer formed on said continuous strip of resistive material.

\* \* \* \* \*